(12) United States Patent
Lakshmanan et al.

(10) Patent No.: US 9,613,859 B2
(45) Date of Patent: Apr. 4, 2017

(54) DIRECT DEPOSITION OF NICKEL SILICIDE NANOWIRE

(71) Applicant: Applied Materials, Inc., Santa Clara, CA (US)

(72) Inventors: Annamalai Lakshmanan, Fremont, CA (US); Bencherki Mebarki, Santa Clara, CA (US); Kaushal K. Singh, Santa Clara, CA (US); Paul F. Ma, Santa Clara, CA (US); Mehul B. Naik, San Jose, CA (US); Andrew Cockburn, Brussels (BE); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/975,231

(22) Filed: Dec. 18, 2015

(65) Prior Publication Data

US 2016/0204027 A1  Jul. 14, 2016

Related U.S. Application Data

(60) Provisional application No. 62/101,796, filed on Jan. 9, 2015.

(51) Int. Cl.
*H01L 21/768* (2006.01)
*H01L 21/285* (2006.01)
(Continued)

(52) U.S. Cl.
CPC .... *H01L 21/76879* (2013.01); *H01L 21/2855* (2013.01); *H01L 21/28518* (2013.01);
(Continued)

(58) Field of Classification Search
CPC ......... H01L 21/76879; H01L 21/28518; H01L 21/76889; H01L 21/76886;
(Continued)

(56) References Cited

U.S. PATENT DOCUMENTS 7,311,946 B2  12/2007  Garg et al.
7,892,602 B2  2/2011  Chung et al.
(Continued)

FOREIGN PATENT DOCUMENTS

WO  2013/048270 A1  4/2013
WO  2013/086482 A1  6/2013

OTHER PUBLICATIONS

PCT Notification of Transmittal of the International Search Report and the Written Opinion of the International Searching Authority for International Application No. PCT/US2015/066870; dated Apr. 25, 2016; 12 total pages.

*Primary Examiner* — Kyoung Lee
(74) *Attorney, Agent, or Firm* — Patterson + Sheridan, LLP

(57) ABSTRACT

Methods for direct deposition of a metal silicide nanowire for back-end interconnection structures for semiconductor applications are provided. In one embodiment, the method includes positioning a substrate in a processing region of a process chamber, the substrate having a first surface comprising a non-dielectric material; and a dielectric layer formed on the first surface. An opening is formed in the dielectric layer, the opening exposing at least a portion of the first surface, the opening having sidewalls. A metal silicide seed is deposited in the opening using a PVD process, wherein the PVD process is performed with either no bias or a bias which creates deposition on the sidewall which is less than 1% of the deposition on the first surface. A metal silicide layer is then selectively deposited on the metal
(Continued)

silicide seed using a metal-silicon organic precursor, creating the metal silicide nanowire.

19 Claims, 4 Drawing Sheets

(51) Int. Cl.
*H01L 21/3205* (2006.01)
*H01L 23/532* (2006.01)
(52) U.S. Cl.
CPC .. *H01L 21/28556* (2013.01); *H01L 21/32053* (2013.01); *H01L 21/76802* (2013.01); *H01L 21/76876* (2013.01); *H01L 21/76886* (2013.01); *H01L 21/76889* (2013.01); *H01L 23/53257* (2013.01); *H01L 23/53271* (2013.01); *H01L 2221/1094* (2013.01)

(58) Field of Classification Search
CPC ......... H01L 21/76876; H01L 21/76802; H01L 21/2855; H01L 2221/1094
See application file for complete search history.

(56) References Cited

U.S. PATENT DOCUMENTS

| | | | |
|---|---|---|---|
| 7,927,942 | B2 | 4/2011 | Raaijmakers |
| 9,129,897 | B2 | 9/2015 | Pore et al. |
| 2003/0036242 | A1 | 2/2003 | Yang |
| 2008/0193359 | A1 | 8/2008 | Yu et al. |
| 2008/0213603 | A1 | 9/2008 | Kobayashi et al. |
| 2013/0171465 | A1* | 7/2013 | Jin ................. H01L 21/2855 428/606 |

* cited by examiner

DIRECT DEPOSITION OF NICKEL SILICIDE NANOWIRE

CROSS-REFERENCE TO RELATED APPLICATIONS

This application claims benefit of U.S. Provisional Application Ser. No. 62/101,796 filed Jan. 9, 2015, which is incorporated by reference in its entirety.

BACKGROUND

Field

Embodiments of the present disclosure generally relate to methods of selective deposition of metal silicides. More specifically, embodiments herein generally relate to metal silicide nanowires in BEOL applications.

Description of the Related Art

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), the materials used to fabricate such components contribute to the electrical performance of such components. As the feature widths decrease, the device current typically remains constant or increases, which results in an increased current density for such features. Higher device densities, faster operating frequencies, and larger die sizes have created a need for a metal with lower resistivity than traditional aluminum to be used in interconnect structures. Copper materials with lower resistivity have been used for decades for its high conductivity. However, as discussed, small size effect may also result in increased resistivity of copper as line widths shrink below around 50 nm and approach the mean free path of electrons in copper (39 nm). The resistivity increase is caused by electron scattering at the surface of the line and at grain boundaries.

Copper (Cu) interconnects have been used as a replacement for Aluminum (Al) for decades. The number of transistors formed on a substrate is reaching a multi-millions range packed in small areas consistent with Moore's law. As the number of transistors increases and the size of transistors decreases, Cu resistivity is exponentially increasing once the metal line dimension approaches or get below the Cu mean free path of 39 nm.

Post Cu era requires new interconnect materials that have low resistivity and narrower mean free path. The mean free path is the average distance traveled by a moving particle (such as an electron, an atom, or a photon) between successive impacts (collisions), which modify its direction or energy or other particle properties. Some metals are already under investigation such as cobalt (Co) interconnect, tungsten (W) Interconnect, and some metal alloys. Silicides, such as Nickel Silicide (Ni—Si) and Cobalt Silicide ($CoSi_2$) interconnects are strong potential candidates given the small mean free path of approximately 5 nm for Ni—Si. Even though Ni—Si resistivity is higher than Cu, the Ni—Si narrow mean free path of approximately 5 nm gives the Ni—Si a strong advantage to replace Cu for advanced future technology nodes of 7 nm and below.

However, current processing methods are not amenable to direct device integration. Most studies involving silicide nanowires have been done with free standing nanowires, as current processing methods can lead to dielectric damage, thermal budget issues, lattice defects and other problems. Regarding thermal budget issues, low resistivity Ni—Si phase formation requires high anneal temperatures of greater than 650 degrees Celsius. Such high anneal temperatures are not suitable in back-end-of-line integration (BEOL), due in part to low-k materials temperature budget limitation (less than about 400 degrees Celsius). Further, controlled growth or selective deposition of nanowire cannot be achieved with existing methods.

Therefore, there is a need for a suitable material for metal interconnection for semiconductor interconnection manufacturing process.

SUMMARY

Embodiments disclosed herein include method of making metal silicides, such as metal silicide nanowires, for BEOL applications. In one embodiment, a method of forming a metal silicide nanowire can include positioning a substrate in a processing region of a process chamber, the substrate having a first surface comprising a non-dielectric material; and a dielectric layer formed on the first surface; forming an opening in the dielectric layer, the opening exposing at least a portion of the first surface, the opening having sidewalls; depositing a metal silicide seed in the opening using a PVD process, wherein the PVD process is performed with either no bias or a bias which creates deposition on the sidewall which is less than 1% of the deposition on the first surface; and selectively depositing a metal silicide layer on the metal silicide seed using a metal-silicon organic precursor.

In another embodiment, a method of forming a nanowire can include positioning a substrate in a processing region of a process chamber, the substrate having a first surface comprising W, Co, Mo, Si or combinations thereof; and a dielectric layer formed on the first surface; forming an opening in the dielectric layer, the opening exposing at least a portion of the first surface, the opening having sidewalls; and selectively depositing a metal silicide layer on the first surface using a metal-silicon organic precursor.

In another embodiment, a method of forming a nanowire can include positioning a substrate in a processing region of a process chamber, the substrate having a first surface comprising a non-dielectric material; and a dielectric layer formed on the first surface; forming an opening in the dielectric layer, the opening exposing at least a portion of the first surface, the opening having sidewalls; depositing a metal silicide seed in the opening using a PVD process, wherein the PVD process is performed with no bias, and wherein the PVD process includes a PVD target which comprises nickel and silicon at a 1:1 ratio; and selectively depositing a nickel silicide layer on the nickel silicide seed using a metal-silicon organic precursor, the deposition comprising delivering the metal-silicon organic precursor with a reactant gas to the processing region; and forming a plasma from the metal-silicon organic precursor and the reactant gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only

DETAILED DESCRIPTION

Embodiments of the present disclosure describe methods for selective direct deposition of a metal silicide nanowire for back-end interconnect structures for semiconductor device manufacturing. In one example, the metal silicide nanowire is selectively deposited in a feature. The metal silicide nanowires can be deposited using a cyclic deposition technique. Suitable deposition techniques may be utilized to form the metal silicide layer include plasma enhanced chemical vapor deposition (PECVD), physical vapor deposition process (PVD), metal-silicon organic chemical vapor deposition (MOCVD), thermal chemical vapor deposition (Thermal-CVD) process, low pressure chemical vapor deposition (LPCVD), sub-atmosphere chemical vapor deposition (SACVD) and the like, or any suitable deposition techniques. In one example, the metal silicide layer may be formed by a chemical vapor deposition with IR light and microwave enhanced plasma. Embodiments disclosed herein are more clearly described with reference to the figures below.

Figure 1A:
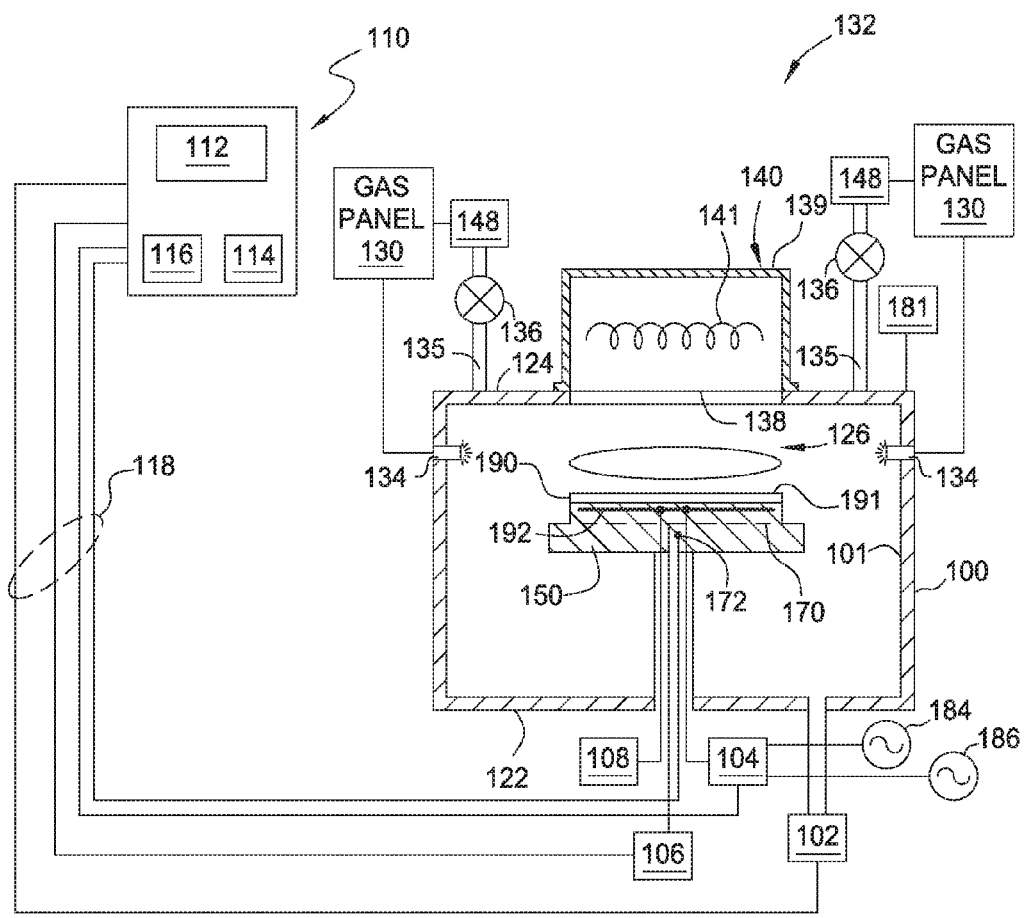
FIG. 1A is a cross section view of a plasma processing chamber adapted to perform a chemical vapor deposition process.

FIG. 1A is a cross sectional view of a plasma processing system 132 suitable for forming a metal silicide nanowire that may be utilized as conductive nanowires in back-end interconnection structures for semiconductor devices manufacture. The processing system 132 may be a suitably adapted CENTURA®, Producer® SE or Producer® GT processing system available from Applied Materials, Inc., of Santa Clara, Calif. It is contemplated that other processing systems, including those produced by other manufacturers, may benefit from embodiments described herein.

The processing system 132 includes a process chamber 100 coupled to a controller 110. The process chamber 100 generally includes a ceiling 124, a side 101 and a bottom wall 122 that define an interior volume 126.

A support pedestal 150 is provided in the interior volume 126 of the chamber 100. The pedestal 150 may be fabricated from aluminum, ceramic, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber 100 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 450 degrees Celsius.

A temperature sensor 172, such as a thermocouple, may be embedded in the support pedestal 150 to monitor the temperature of the pedestal 150 in a conventional manner. The measured temperature is used by the controller 110 to control the power supplied to the heating element 170 to maintain the substrate at a desired temperature.

The pedestal 150 generally includes a plurality of lift pins (not shown) disposed therethrough that are configured to lift the substrate 190 from the pedestal 150 and facilitate exchange of the substrate 190 with a robot (not shown) in a conventional manner.

The pedestal 150 comprises at least one electrode 192 for retaining the substrate 190 on the pedestal 150. The electrode 192 is driven by a chucking power source 108 to develop an electrostatic force that holds the substrate 190 to the pedestal surface, as is conventionally known. Alternatively, the substrate 190 may be retained to the pedestal 150 by clamping, vacuum or gravity.

In one embodiment, the pedestal 150 is configured as a cathode having the electrode 192 embedded therein coupled to at least one RF bias power sources 184, 186. Although the example depicted in FIG. 1A shows two RF bias power sources, 184, 186, it is noted that the numbers of the RF bias power sources may be any number as needed. The RF bias power sources 184, 186 are coupled between the electrode 192 disposed in the pedestal 150 and another electrode, such as a showerhead assembly 142 (depicted in FIG. 4B) or ceiling (lid 124) of the processing chamber 100. The RF bias power source 184, 186 excites and sustains a plasma discharge formed from the gases disposed in the processing region of the processing chamber 100.

In the embodiment depicted in FIG. 1A, the dual RF bias power sources 184, 186 are coupled to the electrode 192 disposed in the pedestal 150 through a matching circuit 104. The signal generated by the RF bias power 184, 186 is delivered through matching circuit 104 to the pedestal 150 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom 122 of the chamber 100. The vacuum pump 102 is used to maintain a desired gas pressure in the process chamber 100. The vacuum pump 102 also evacuates post-processing gases and by-products of the process from the chamber 100.

A light source 140 is disposed on the processing chamber 100 partially defining the lid 124 of the processing chamber 100. The light source 140 is configured to provide heat energy to the substrate 190 disposed on the substrate pedestal 150 through a window 138. The window 138 is typically made from quartz disposed in the lid 124 of the processing chamber 100 and is at least partially covered by the light source 140.

The light source 140 may comprise various types of radiant heaters. In one example, the light source 140 includes a housing 139 having one or more light sources 141 disposed therein. A power connection (not shown) may be coupled to the light source 140 to facilitate providing power to the light sources 141. In one example, the one or more light sources 141 disposed in the light source 140 may provide radiant energy, such as an IR radiation and/or longer wavelength of UV radiation having a wavelength between about 400 nm and about 4000 nm, to the substrate 190. In one embodiment, radiant energy provided from light sources 141 is believed to enhance photons generated from the plasma to be emitted to the substrate 190 to facilitate chemical reaction during processing. The light sources 141 provide IR and/or UV light, e.g., photons, in the plasma, thus enhancing distribution of photons across the substrate surface 191.

The processing chamber 100 includes one or more gas delivery passages 135 coupled through the lid 124 or sidewalls 101 of the processing chamber 100. The gas delivery passages 135 and the vacuum pump 102 are positioned at opposite ends of the processing chamber 100 to induce laminar flow within the interior volume 126 to minimize particulate contamination. In one embodiment, two more gas delivery passages 135 are disposed through the lid 124 of the processing chamber 100. The gas delivery passage 135 typically is coupled to a valve 136 to selectively allow processing gases from the gas panel 130 flowing into and out of the interior volume 126. Alternatively, the additional passages 134 may be positioned at adjacent walls 101 to provide a more uniform gas distribution across a surface 191 of the substrate 190.

The gas delivery passage 135 is coupled to the gas panel 130 through the valve 136 to provide a gas mixture into the interior volume 126. In one embodiment, the gas delivery passages 135 may be configured as a gas distribution ring wherein the gas mixture may be distributed from adjacent the walls 101 through an array of holes to optimize the flow uniformity. In another embodiment, the gas mixture may be supplied to the processing chamber 100 through a gas distribution plate, such as showerhead 142 (shown in FIG. 1B) disposed below the light source 140. The gas distribution plate may be fabricated by a material transmissive to the heat generated from the light source 140 such as not to substantially interfere with the heating of the substrates positioned on the substrate pedestal 150. Examples of gases that may be supplied from the gas panel 130 may include metal-silicon organic precursors and carrier gases. The metal-silicon organic precursors can have the general formula Nickel silicon-$N_xC_yH_z$, wherein x=0-5, y=1-5, z=0-10. Other metal-silicon organic precursors may be selected from gases containing transition metal elements, such as Ni, Ti, Fe, Co, Cr, Mn or combinations thereof. Suitable carrier gas includes nitrogen ($N_2$), argon (Ar), hydrogen ($H_2$), alkanes, alkenes, helium (He), oxygen ($O_2$), ozone ($O_3$), wafer vapor ($H_2O$), and the like.

In one embodiment, a remote plasma source (RPS) 148 may be alternatively coupled to the gas delivery passages 135 to assist in forming a plasma in the interior volume 126. The remote plasma source 148 provides plasma formed from the gas mixture provided by the gas panel 130 to the processing chamber 100.

Furthermore, a microwave generator 181 may be coupled to the lid 124 (or the wall 101) of the processing chamber 100. Similarly, the microwave generator 181 coupled to the processing chamber 100 may assist dissociating of the gases from the gas mixture to become reactive species, so as to enhance the chemical reaction across the substrate surface 191.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1A.

Figure 1B:
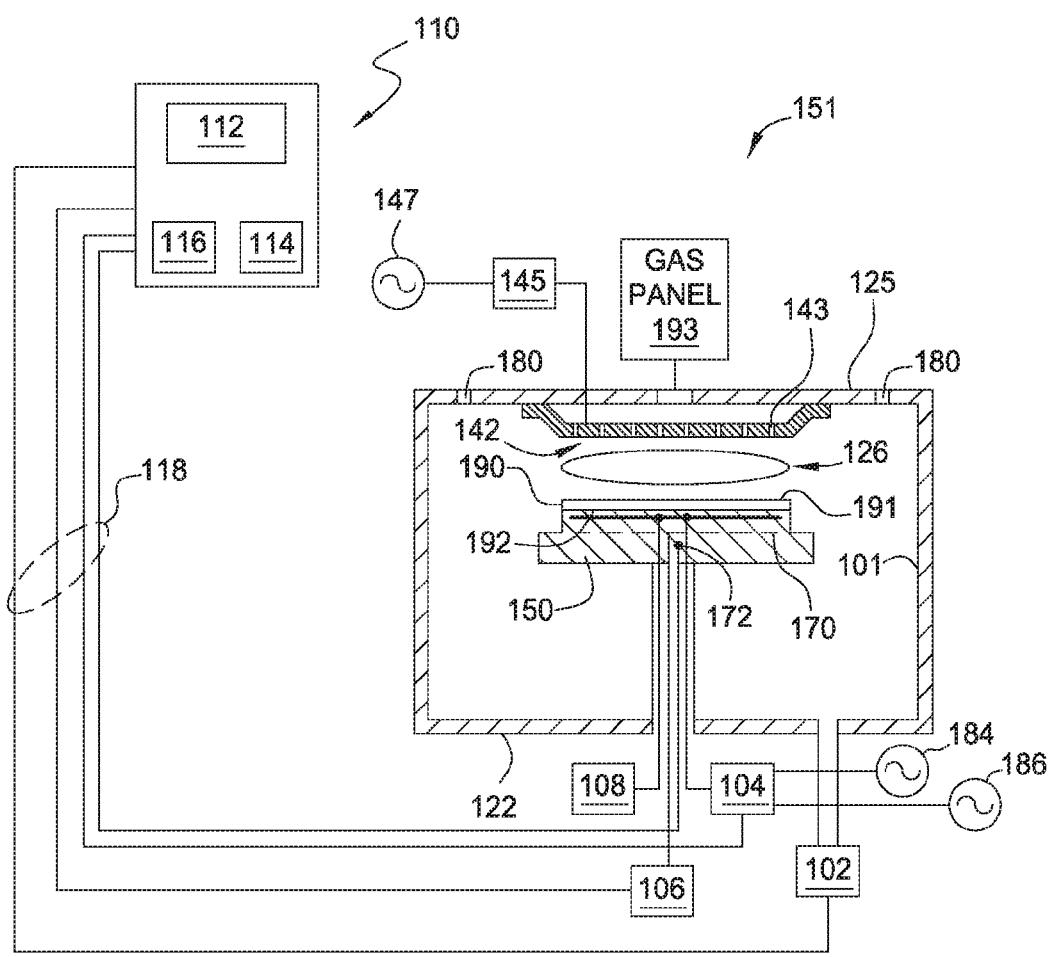
FIG. 1 B is a cross section view of another embodiment of a plasma processing chamber adapted to perform a chemical vapor deposition process.

FIG. 1B depicts another embodiment of a plasma processing chamber 151 that may be utilized to form a metal silicide nanowire. The configuration of the plasma processing chamber 151 depicted in FIG. 1B is similar to the configuration of the processing chamber 100 depicted in FIG. 1A, but with the showerhead 142 coupled to a ceiling 125 of the processing chamber 151. Unlike the light source 140 of FIG. 1A is disposed above the ceiling of the processing chamber 100, the processing chamber 151 depicted in FIG. 1B has a light source 180 formed on an edge of the ceiling 125 while having the gas panel 193 disposed on a center region of the ceiling 125 of the processing chamber 151. The light source 180 may be in form of annular arrays. Similarly, the light source 180 is similar to the light source 141 that may provide radiation that enhances photon generation in the plasma which may assist chemical reaction occurred on the substrate surface 191.

In one example, the showerhead 142 having a plurality of apertures 143 is coupled to the ceiling 125 of the process chamber 100 above the pedestal 150. The apertures 143 of the showerhead 142 are utilized to introduce process gases from the gas panel 193 into the chamber 151. The apertures 143 may have different sizes, number, distributions, shape, design, and diameters to facilitate the flow of the various process gases for different process requirements. A plasma is formed from the process gas mixture exiting the showerhead 142 to enhance thermal decomposition of the process gases resulting in the deposition of material on the surface 191 of the substrate 190.

The showerhead 142 and substrate support pedestal 150 may be formed a pair of spaced apart electrodes in the interior volume 126. One or more RF sources 147 provide a bias potential through a matching network 145 to the showerhead 142 to facilitate generation of a plasma between the showerhead 142 and the pedestal 150. Alternatively, the RF power sources 147 and matching network 145 may be coupled to the showerhead 142, substrate pedestal 150, or coupled to both the showerhead 142 and the substrate pedestal 150, or coupled to an antenna (not shown) disposed exterior to the chamber 151. In one embodiment, the RF sources 147 may provide between about 10 Watts and about 3000 Watts at a frequency of about 30 kHz to about 13.6 MHz. Alternatively, the RF source 147 may be a microwave generator that provide microwave power to the showerhead 142 that assists generation of the plasma in the interior volume 126.

Figure 2:
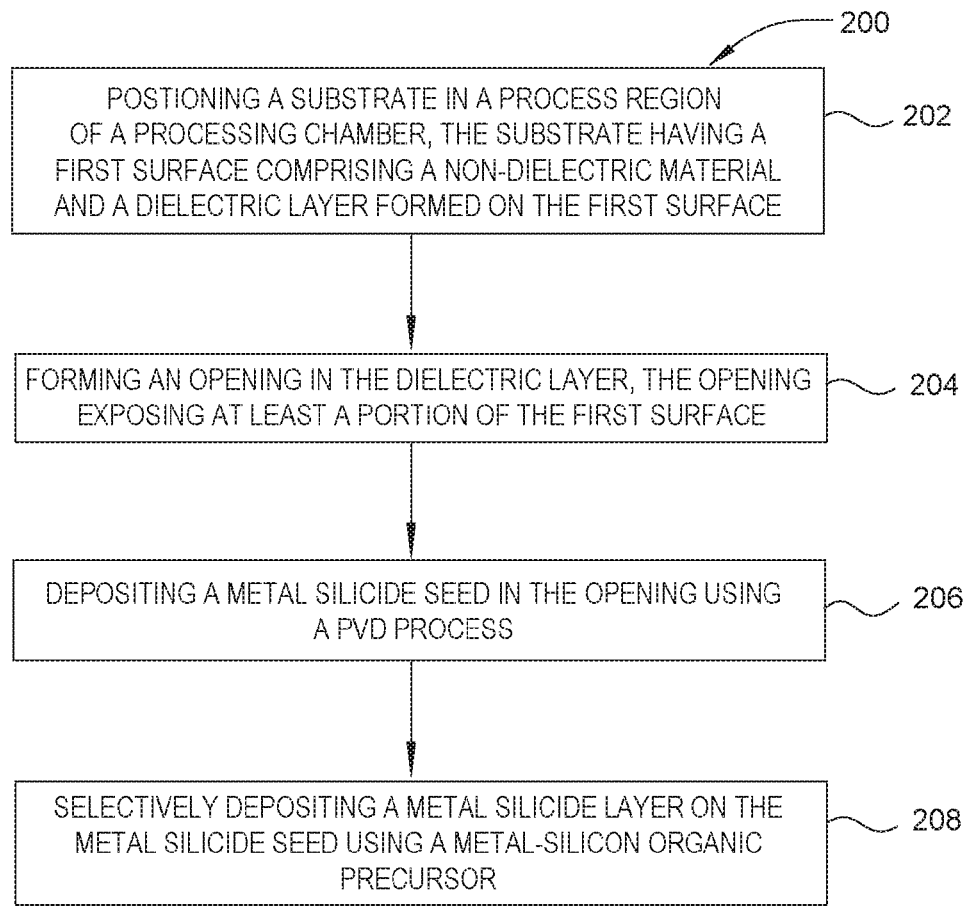
FIG. 2 depicts a flow diagram for forming a metal silicide nanowire on a substrate, according to one embodiments.

FIG. 2 illustrates a method 200 used to form a metal silicide nanowire at a low temperature, such as less than 400 degrees Celsius, on a substrate. The metal silicide nanowire is formed selectively on non-dielectric regions. The sequence described in FIG. 2 corresponds to the fabrication stages depicted in FIGS. 3A-3E, which is discussed below. FIGS. 3A-3E illustrate schematic cross-sectional views of a substrate 300 having a conductive layer 302 disposed thereon that may include a metal silicide nanowire 314, formed using the method 200 described in FIG. 2.

Figure 3A:
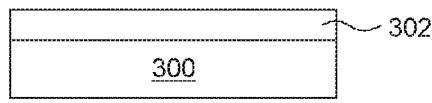
FIGS. 3A-3E depict cross-sectional views of a metal silicide nanowire formed on a substrate in accordance with the process depicted in FIG. 2; and To facilitate understanding, identical reference numerals have been used, wherever possible, to designate identical elements that are common to the Figures. Additionally, elements of one embodiment may be advantageously adapted for utilization in other embodiments described herein.
Figure 3B:
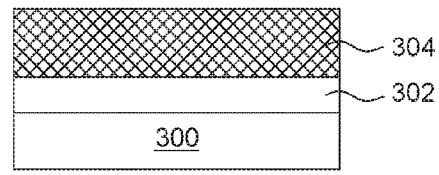
Figure 3C:
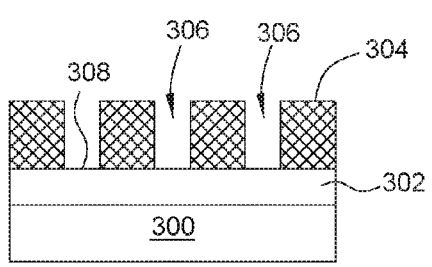
Figure 3D:
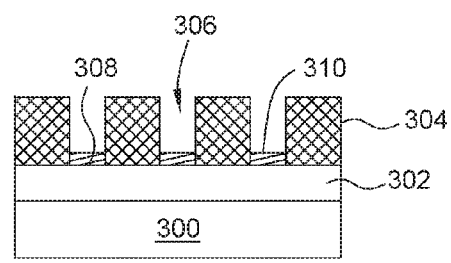
Figure 3E:
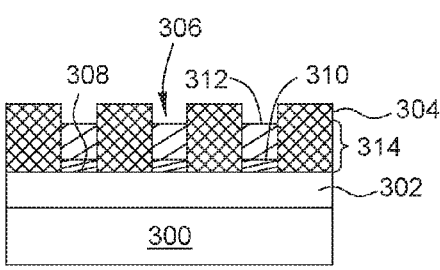

The method 200 begins by positioning a substrate, such as the substrate 300 depicted in FIG. 3A, in a processing region of a process chamber, the substrate having a first surface comprising a non-dielectric material and a dielectric layer formed on the first surface, at 202. The processing chamber may be a processing chamber described above, such as the processing chambers 100 and 151 depicted in FIG. 1A and 1B, or another suitable processing chamber. The substrate 300 shown in FIG. 3A has an optional conductive layer 302 formed on the substrate 300. The conductive layer 302 may include W, Co, Mo, Si or combinations thereof. In one example, the substrate 300 may have a substantially planar surface, an uneven surface, or a substantially planar surface having a structure formed thereon. The substrate 300 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 300 may have various dimensions, such as 200 mm or 300 mm diameter wafers, as well as, rectangular or square panels. Unless otherwise noted, embodiments and examples described herein are conducted on substrates with a 300 mm diameter. In the example wherein a SOI structure is utilized for the substrate 300, the substrate 300 may include a buried dielectric layer disposed on a silicon crystalline substrate. In the embodiment depicted herein, the substrate 300 may be a crystalline silicon substrate.

The substrate 300 also has a dielectric layer 304. The dielectric layer 304 may have openings 306, formed therein configured to have at least one conductive layer disposed therein laterally bounded by the dielectric layer 304. The dielectric layer 304 may be any suitable silicon oxide containing materials, SiN containing materials, SiOC containing materials, SiC containing materials, carbon based materials, or any other suitable materials. In one example, the dielectric layer 304 is a dielectric material having a dielectric constant less than 4.0 (e.g., a low-k material). Examples of suitable materials include carbon-containing silicon oxides (SiOC), such as BLACK DIAMOND® dielectric material available from Applied Materials, Inc., located in Santa Clara, Calif., and other low-k polymers, such as polyamides.

An opening 306 can then be formed in the dielectric layer 304, the opening 306 exposing at least a portion of the first surface 308, at 204. The opening 306 may be formed using a photoresist/etch process. The opening 306 may be created to the approximate width of the desired metal silicide nanowire. The first surface 308 is the deposition surface of the substrate 300. As such, the first surface 308 may have the same composition as the substrate 300 or the first surface 308 may have a composition as defined by an overlying layer, such as the optional conductive layer 302.

A metal silicide seed 310 is then deposited on the first surface 308 in the opening 306 using a PVD process, wherein the PVD process is performed with either no bias or a bias which creates deposition on the sidewall which is less than 1% of the deposition on the first surface, at 206. The PVD process includes the formation of a plasma from a sputtering gas. The sputtering gas may be an inert gas, such as Ar or Ne. the sputtering gas is used to sputter a target material to the substrate. The target material can be a single target comprise a metal and silicon composition, such as a metal silicide. In one example, the target material is a nickel and silicon target. In another embodiment, multiple targets are used, wherein the metal and the silicon are derived from separate targets. The ratio of metal to silicon may be adjusted to account for different sputter rates. In one embodiment, nickel and silicon are used in the sputter target or targets at a ratio of 1:1. The sputter time may be between about 1 second and about 20 seconds for a 300 mm substrate. The DC Power can be from about 1000 W to about 40,000 W with an AC Bias of from about 10 W to about 60 W. The sputter gas flow-rate can be from about 1 sccm to about 5 sccm. The substrate temperature can be between 25 degrees Celsius and 400 degrees Celsius, such as between about 25 degrees Celsius and about 200 degrees Celsius.

A PVD target of desired composition (e.g., 50% Ni 50% Si) or multicathode may be used. The Ni—Si composition may be adjusted to account for different sputter rates of Ni and Si or multiple sputter gases may be used. In one example, Ar is used to sputter the target material into desired feature, without any bias. No bias or minimal bias is believed to put the material of desired composition at the bottom of the feature, and not on sidewalls. The PVD deposited portion becomes the metal silicide seed for nanowire growth.

A metal silicide layer 312 is then selectively deposited on the metal silicide seed 310 using a metal-silicon organic precursor, at 208. In one embodiment, the metal-silicon organic precursors can have the general formula Nickel silicon-$N_xC_yH_z$, wherein x is an integer between 0 and 5, y is an integer between 1 and 5, and z is an integer between 0 and 10. Examples of suitable metal-silicon organic precursors are Metal bis(trimethylsilyl)am ides, Nickel bis (trimethylsilyl)amides and the like.

The metal silicide layer 312 can be deposited by a CVD or a PECVD process. In embodiments having a 300 mm diameter substrate, the chamber pressure can be between about 1 torr and about 30 torr. The wafer backside pressure can be at least 1 torr lower than chamber pressure. In one example, the chamber pressure is 2 torr. Thus, the wafer backside pressure would be less than 1 torr. The wafer to showerhead spacing can be from about 100 mils to about 800 mils. The Nickel silicon-NxCyHz (x=0-5, y=0-5, z=0-10) precursor can be delivered at about 0.5 mg/min to about 10 mg/min. in PECVD embodiments, the plasma frequency can be from about 13.56 MHz to about 60 MHz for direct capacitively coupled plasma. Optional remote plasma can be an inductively coupled plasma, with an RF Power of from about 0 W (no plasma) to about 1000 W. The plasma can be formed using a plasma gas such as $H_2$, $N_2$, Ar, He, $NH_3$. The reactant/plasma gas flow rate can be from about 100 sccm to about 6000 sccm. The precursor and plasma gas can be flowed together into the process chamber during deposition or flowed successively one after the other. Flowing the precursor and reactant/plasma gas are flowed together creates a thermal CVD/PECVD process. If precursor is flowed first, followed by reactant/plasma gas, the metal silicon organic precursor is deposited by thermal deposition followed by thermal treatment/plasma treatment. Deposition time is determined by the growth rate and the feature size (via depth).

The above parameters can further be adapted to an ALD process. In an ALD process, the precursor exposure time is from about 0.1 s to about 5 s. The precursor is then purged using an inert gas for between about 1 s to about 10 s. The plasma gas is then activated and delivered to the substrate and the metal silicide layer 312 for about 0.1 s to about 5 s. The plasma gas is then purged using an inert gas for between about 1 s to about 10 s.

The metal silicide layer 312 can be deposited thin, such as less than 5 atoms thick. In one embodiment, the metal-silicide layer is less than 2 atoms thick, such as a monolayer. The metal- silicide layer may be deposited thin by controlling the residency time of the gas present in the process region, by using a self-limiting deposition gas or by other methods. In one embodiment, the metal-silicide reactant supplied in the deposition gas mixture may be maintained at a flow rate by volume between about 20 sccm and about 200 sccm. The metal silicide layer 312 and the metal-silicide seed 310 form a metal silicide nanowire 314.

In some embodiments, a carrier gas, such as nitrogen ($N_2$) and nitric oxide (NO), $O_2$, $N_2O$, hydrogen ($H_2$), ammonia ($NH_3$), a mixture of hydrogen ($H_2$) and nitrogen ($N_2$) and/or inert gas, such as argon (Ar) and helium (He), may be supplied with the metal-silicon organic precursors into the processing chamber. The addition of different carrier gases or inert gases may change the film structure and/or film chemical components, such as resistivity, thereby adjusting the deposited film to have a desired film property to meet different process requirements.

While supplying either the metal-silicon organic precursors, an inert gas may also be supplied to assist the profile control as needed. Examples of the inert gas supplied in the gas mixture include Ar, He, Ne, Kr, Xe or the like.

Several process parameters may also be controlled while supplying the metal-silicon organic precursors to perform the deposition process. The pressure of the processing chamber may be controlled at between about 0.5 milliTorr and about 5 Torr. A substrate temperature is maintained less than 400 degrees Celsius, such as between about 15 degrees Celsius to about 400 degrees Celsius, for example between about 200 degrees Celsius and about 380 degrees Celsius. It is believed that low temperature, temperature less than 400 degrees Celsius, is desirable in fabricating nanowires for the semiconductor devices so as to minimize damages, e.g., undesired mechanical densification to the nearly low k materials or conductive material melt-down, on the fabricated device structures. The deposition process (e.g., either gas delivery) may be performed for between about 30 seconds and about 300 seconds to deposit the nickel silicide seed 310. The resulting metal silicide layer 312, formed in the shape of nanowires, can have a thickness between about 10 Å and about 100 Å.

The metal silicide (e.g., NiSi, $Ni_2Si$, $Ni_3Si_2$) nanowire 312 as formed herein has high thermal stability, low electrical resistivity and high purity, making the metal silicide nanowire 314 as a good candidate for use in nanowires in back-end semiconductor devices.

Though described above with relation to nickel, metal silicide can include other metals species. According to one embodiment, the metal species in the metal silicide nanowire can also be varied depending on the application and material properties desired, such as conductivity, bandgap, work function and phase. Example metal species of interest for nanowires include Ni, Ti, Fe, Co, Cr, Mn, or other transition metal elements. The method of fabricating these nanowires can include delivery of silicon to the metal surface, delivery of the metal to silicon nanowires, or simultaneous delivery of silicon and the metal species.

While forming the plasma from the deposition gas and/or the reacting gas, a light radiation may be emitted to the deposition gas and/or the reacting gas in the plasma so as to enhance dissociation of the gas mixtures into reactive species. The light radiation may be emitted from the light source 140 mounted on the processing chamber 100, as depicted in FIG. 1A, or from the light source 180 formed on an edge of the processing chamber 151 depicted in FIG. 1B.

It is believed that the radiant energy, e.g., photons, from the light sources 140, 180 may enhance generation of the IR/UV light, e.g., photons, at the substrate surface, thereby enhancing the chemical reaction occurring at the substrate surface without having to excessively increase the substrate temperature. In one embodiment, the light sources 140, 180 may emit a radiant energy at a wavelength between about 1 mm and about 1000 mm. The radiant energy may include an IR light, UV light, or combinations thereof.

The deposition of the metal silicide layer 312 can be repeated one or more times to deposit a metal silicide nanowire. The metal silicide nanowire may be deposited as a blanket across the surface of the substrate/barrier layer, into one or more features or both. In one embodiment, the repeated deposition includes the metal silicide deposition as described above being repeated sequentially one or more times.

After a desired thickness of the metal silicide layer 312 is reached, the deposition process may then be terminated. In one example, the metal silicide layer 312 is a nickel rich film with higher ratio of nickel elements than the ratio of the silicon elements formed in the metal silicide layer 312. In one example, the metal silicide layer 312 may have a ratio of Ni element to Si element substantially between about 0.8:1 and about 2:1. More nickel elements are formed on an upper/outer region of the metal silicide layer 312, as compared to the silicon elements formed in a lower/inner region of the metal silicide layer 312. XRD analysis indicates that the metal silicide layer 312 as formed has strong (111), (220) and (311) plane peaks. The metal silicide layer 312 may have a resistivity between about 8 µOhm-cm and about 25 µOhm-cm.

In some embodiment, the deposition method 200 may include a thermal annealing process. The deposition process may be the method 200 described above incorporating any suitable deposition techniques, such as plasma enhanced chemical vapor deposition (PECVD), physical vapor deposition process (PVD), metal-silicon organic chemical vapor deposition (MOCVD), thermal chemical vapor deposition (Thermal-CVD) process, low pressure chemical vapor deposition (LPCVD), sub-atmosphere chemical vapor deposition (SACVD) and the like, followed by a thermal annealing process. After the metal silicide layer 312 is formed on the substrate 300, a low temperature, such as less than 400 degrees Celsius, thermal/annealing process may be performed on the metal silicide layer 312 in a thermal processing chamber, such as a RTP chamber or any suitable heating processing chamber. The thermal processing chamber may be similarly configured as the processing chamber described in FIGS. 1A and 1B, with a heating module, such as a lamp or heating assembly formed therein with a microwave generator coupled thereto. The microwave power applied during thermal/annealing process may gently heat/thermal process the metal silicide layer 312 without adversely destroy or damage the film structures of the metal silicide layer 312. In one example, the microwave power may be operated at a frequency between 0.3 GHz and about 300 GHz. The microwave power may be applied between about 10 Watts and about 5000 Watts. While performing the thermal/annealing process, a carrier gas may be supplied during the heat/thermal process. The carrier gas may be selected from a group consisting of $N_2$, $O_2$, $H_2$, inert gas, or any suitable gases as needed.

While performing the thermal/annealing process, a microwave power and/or a light radiation may be emitted to the metal silicide nanowire 314 so as to enhance reconstruction of the film structures of the metal silicide nanowire 314. It is believed that the radiant energy, e.g., photons, may enhance the film structure rearrangement or reconstruction to the metal silicide layer 312. In one embodiment, the light radiation may have a wavelength between about 1 mm and about 1000 mm. The light radiation may include an IR light, UV light, or combinations thereof.

The thermal/annealing process followed by the deposition process is performed to repair, densify and enhance lattice structures of the metal silicide layer 312. For example, after the thermal/annealing process, the metal silicide layer 312 may have stronger crystalline structures of (111), (220) and (311) plane peaks under XRD analysis, as compared to the metal silicide layer 312 prior to, e.g., without, the thermal/annealing process.

In another embodiment, the PVD seed portion is not deposited. The optional conductive layer 302 or other underlying structure may be deposited with the metal silicon organic precursor. The conductive layer 302 allows for selective deposition, as the metal silicon organic precursor deposits preferentially on the conductive layer 302. The opening can be prepared such that the sidewalls are low-k dielectric that is surface terminated with —CH3 (methyl) species. The bottom of the opening can be prepared such that the metal surface in the bottom is terminated with —NH or —OH species. The metal silicon organic precursor preferentially adsorbs to a —OH or —NH terminated surface (as opposed to a —CH3 terminated surface); and exposure of the M—Si organic precursor to the surface-prepared-via will lead to selective deposition just on the metal surface and not on the dielectric surface.

Thus, methods for forming a metal silicide nanowires selectively and at low temperature are provided. The method and apparatus advantageously forming a metal silicide nanowire at a temperature less than 400 degrees Celsius utilizing a plasma enhanced chemical vapor deposition or other suitable deposition techniques. The metal silicide nanowire are formed directly in a feature without deposition on the dielectric layer for next generation semiconductor devices. Further, the metal silicide nanowires and resulting nanowires are deposited in a low resistivity phase at lower temperature (below 400 degrees Celsius). Thus, the metal silicide nanowires are suitable for interconnect integration while maintaining the thermal budget for BEOL deposition.

While the foregoing is directed to embodiments of the disclosed devices, methods and systems, other and further embodiments of the disclosed devices, methods and systems may be devised without departing from the basic scope thereof, and the scope thereof is determined by the claims that follow.

What is claimed is:

1. A method of forming a metal silicide nanowire comprising:
   positioning a substrate in a processing region of a process chamber, the substrate having:
      a first surface comprising a non-dielectric material; and
      a dielectric layer formed on the first surface;
   forming an opening in the dielectric layer, the opening exposing at least a portion of the non-dielectric material having the first surface, the opening having sidewalls;
   depositing a metal silicide seed in the opening using a PVD process, wherein the PVD process is performed with either no bias or a bias which creates deposition on the sidewall which is less than 1% of the deposition on the first surface; and
   selectively depositing a metal silicide layer on the metal silicide seed using a metal-silicon organic precursor.

2. The method of claim 1, wherein the PVD process comprises a nickel and silicon PVD target, the target having a nickel to silicon ratio of about 1:1.

3. The method of claim 1, wherein the PVD process comprises a nickel PVD target and silicon PVD target.

4. The method of claim 1, wherein the metal-silicon organic precursor is Nickel silicon-NxCyHz, wherein x is an integer between 0 and 5, y is an integer between 1 and 5, and z is an integer between 0 and 10.

5. The method of claim 1, wherein selectively depositing a metal silicide layer comprises:
   delivering the metal-silicon organic precursor with a reactant gas to the processing region; and
   forming a plasma from the metal-silicon organic precursor and the reactant gas.

6. The method of claim 1, wherein selectively depositing a metal silicide layer comprises:
   delivering the metal-silicon organic precursor to the processing region to deposit the metal silicide layer; and
   delivering a plasma comprising a reactant gas to the metal silicide layer.

7. The method of claim 1, wherein the first surface has an exposed terminal —OH or —NH group.

8. The method of claim 1, wherein the substrate is maintained at temperature between about 25 degrees Celsius and 400 degrees Celsius.

9. The method of claim 1, wherein the metal silicide seed and the metal silicide layer comprise a metal selected from the group consisting of Ni, Ti, Fe, Co, Cr, and Mn.

10. The method of claim 1, further comprising annealing the metal silicide seed and the metal silicide layer, the annealing further comprises radiant energy activation.

11. A method of forming a nanowire comprising:
   positioning a substrate in a processing region of a process chamber, the substrate having:
      a first surface comprising W, Co, Mo, Si or combinations thereof; and
      a dielectric layer formed on the first surface;
   forming an opening in the dielectric layer, the opening exposing at least a portion of the W, Co, Mo, Si or combinations thereof of the first surface, the opening having sidewalls; and
   selectively depositing a metal silicide layer on the first surface using a metal-silicon organic precursor, wherein the first surface has an exposed terminal —OH or —NH group.

12. The method of claim 11, wherein the metal-silicon organic precursor is Nickel silicon-NxCyHz, wherein x is an integer between 0 and 5, y is an integer between 1 and 5, and z is an integer between 0 and 10.

13. The method of claim 11, wherein selectively depositing a metal silicide layer comprises:
  delivering the metal-silicon organic precursor with a reactant gas to the processing region; and
  forming a plasma from the metal-silicon organic precursor and the reactant gas.

14. The method of claim 11, wherein selectively depositing a metal silicide layer comprises:
  delivering the metal-silicon organic precursor to the processing region to deposit the metal silicide layer; and
  delivering a plasma comprising a reactant gas to the metal silicide layer.

15. The method of claim 11, wherein the substrate is maintained at temperature between about 25 degrees Celsius and 400 degrees Celsius.

16. The method of claim 11, wherein the metal silicide layer comprise a metal selected from the group consisting of Ni, Ti, Fe, Co, Cr, and Mn.

17. The method of claim 11, further comprising annealing the metal silicide layer, the annealing further comprises radiant energy activation.

18. A method of forming a nanowire comprising:
  positioning a substrate in a processing region of a process chamber, the substrate having:
    a first surface comprising a metal, the first surface having an exposed terminal —OH or —NH group; and
    a dielectric layer formed on the first surface, the dielectric layer having a terminal —$CH_3$ (methyl) species;
  forming an opening in the dielectric layer, the opening exposing at least a portion of the metal of the first surface, the opening having sidewalls;
  depositing a nickel silicide seed in the opening using a PVD process, wherein the PVD process is performed with no bias, and wherein the PVD process includes a PVD target which comprises nickel and silicon at a 1:1 ratio; and
  selectively depositing a nickel silicide layer on the nickel silicide seed using a metal-silicon organic precursor, the deposition comprising:
    delivering the metal-silicon organic precursor with a reactant gas to the processing region; and
    forming a plasma from the metal-silicon organic precursor and the reactant gas.

19. The method of claim 18, further comprising annealing the nickel silicide seed and the nickel silicide layer, wherein the annealing further comprises radiant energy activation.

* * * * *